(12) United States Patent
Thurgood (10) Patent No.: US 11,282,814 B2
(45) Date of Patent: Mar. 22, 2022

(54) SEMICONDUCTOR DEVICE ASSEMBLIES INCLUDING STACKED INDIVIDUAL MODULES

(71) Applicant: Micron Technology, Inc., Boise, ID (US)

(72) Inventor: Blaine J. Thurgood, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 16/728,750

(22) Filed: Dec. 27, 2019

(65) Prior Publication Data

US 2021/0202443 A1 Jul. 1, 2021

(51) Int. Cl.
| | | |
|---|---|---|
| *H01L 25/065* | (2006.01) | |
| *H01L 23/31* | (2006.01) | |
| *H01L 23/00* | (2006.01) | |
| *H01L 21/56* | (2006.01) | |
| *H01L 25/00* | (2006.01) | |

(52) U.S. Cl.
CPC ........ *H01L 25/0657* (2013.01); *H01L 21/565* (2013.01); *H01L 23/3157* (2013.01); *H01L 24/32* (2013.01); *H01L 25/50* (2013.01); *H01L 2224/32145* (2013.01); *H01L 2225/0651* (2013.01); *H01L 2225/06565* (2013.01)

(58) Field of Classification Search
CPC ... H01L 25/0657; H01L 25/50; H01L 21/565; H01L 2225/0651; H01L 2225/06565; H01L 2224/32147; H01L 2224/32145; H01L 24/48; H01L 24/49; H01L 24/32; H01L 23/3157
See application file for complete search history.

(56) References Cited

U.S. PATENT DOCUMENTS

| | | |
|---|---|---|
| 2003/0111720 A1 | 6/2003 | Tan et al. |
| 2008/0150158 A1 | 6/2008 | Chin |
| 2010/0314740 A1 | 12/2010 | Choi et al. |

(Continued)

OTHER PUBLICATIONS

Tuckerman, D. B. et al., "Laminated Memory: a New 3-Dimensional Packaging Technology for MCMs", Conference Paper, Apr. 1994, © 1994 IEEE, pp. 58-63.

(Continued)

*Primary Examiner* — Jasmine J Clark (74) *Attorney, Agent, or Firm* — Perkins Coie LLP (57) ABSTRACT

A semiconductor device assembly can include a substrate including a plurality of external connections. The assembly can include a first individual module and a first bond pad. The first individual module can be disposed on the substrate such that the first side of the first individual module faces the substrate. In some embodiments, the first individual module electrically is coupled to an external connection of the substrate via the first bond pad. The assembly can include a second individual module comprising a plurality of lateral sides. The second individual module can be disposed over the first individual module. In some embodiments, a first lateral side of the second individual module includes a first step forming a first overhang portion and a first recess. In some embodiments, the first bond pad is vertically aligned with the first recess of the second individual module.

23 Claims, 8 Drawing Sheets

(56) References Cited

U.S. PATENT DOCUMENTS

2013/0015570 A1* 1/2013 Sato .................... H01L 23/3135
                                                                                               257/737

OTHER PUBLICATIONS

U.S. Appl. No. 16/237,051—Unpublished U.S. Patent Application by Jonathan S. Hacker, titled "Systems and Methods for Forming Semiconductor Cutting/Trimming Blades", filed Dec. 31, 2018, 20 pages.
TW Patent Application No. 109145322—Taiwanese Office Action and Search Report, dated May 27, 2021, with English Translation, 17 pages.

* cited by examiner

SEMICONDUCTOR DEVICE ASSEMBLIES INCLUDING STACKED INDIVIDUAL MODULES

TECHNICAL FIELD

The present disclosure generally relates to semiconductor devices, and more particularly relates to semiconductor device assemblies including multiple stacks of individual modules (e.g., individual testable modules (ITM's)).

BACKGROUND

Packaged semiconductor devices, including memory chips, microprocessor chips, and imager chips, typically include one or more individual modules mounted on a substrate and encased in a plastic protective covering or covered by a heat-conducting lid. The bond pads can be electrically connected to terminals outside the protective covering to allow the individual module to be connected to higher level circuitry.

Figure 1:
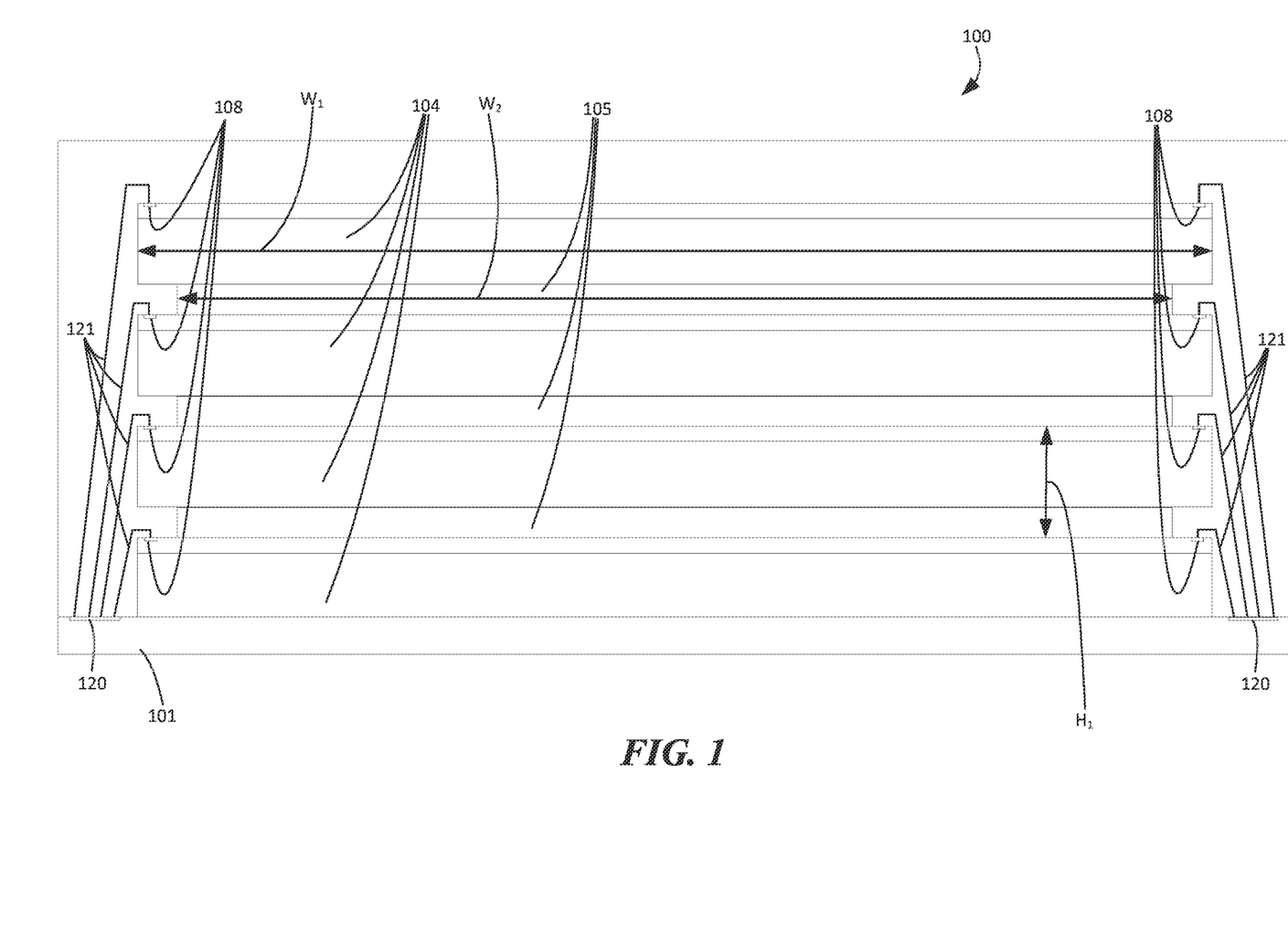
FIG. 1 illustrates a semiconductor device assembly including a stack of individual modules spaced apart by spacer tape.

To provide additional functionality, additional individual modules can be added to a semiconductor device assembly. One approach to including additional individual modules involves stacking the individual modules over the substrate. FIG. 1 illustrates a semiconductor device assembly 100 in which spacer tape and/or other material are used to space the individual modules vertically (e.g., in a direction perpendicular to the plane of the spacer tape) from each other to provide access to bond pads (e.g., contact pads) on the individual modules 104. As illustrated, the spacer tape has a smaller width W1/cross-sectional area (as measured parallel to the plane of the spacer tape) than the width W2/cross-sectional area of the individual modules 104, thereby leaving exposed one or more bond pads 108 of the individual modules for wirebond connection to the substrate 101 (e.g., to the bonding site(s) 120 of the substrate 101) on which the individual modules 104 are positioned via one or more wirebonds 121. As illustrated, the use of spacer tape 105 results in in extensive height H1 for one or more of the individual modules 104.

One approach to facilitate the electrical connection of individual modules to the substrate and reduce the vertical space that may be required for spacers is to arrange the individual modules in one or more shingled stacks, where each individual module is offset horizontally from an individual module below to leave exposed contact pads of the individual module that can be bonded (e.g., with a wirebond) to a corresponding bonding site (e.g., bondfinger, bondpad, or other bonding site) on the substrate. A drawback of this shingled stacking approach is the limit on the number of individual modules that can be stacked in this fashion, due to the increasing amount of overhang of each additional individual module added to the stack and corresponding increase in size in directions parallel to the substrate.

Figure 2:
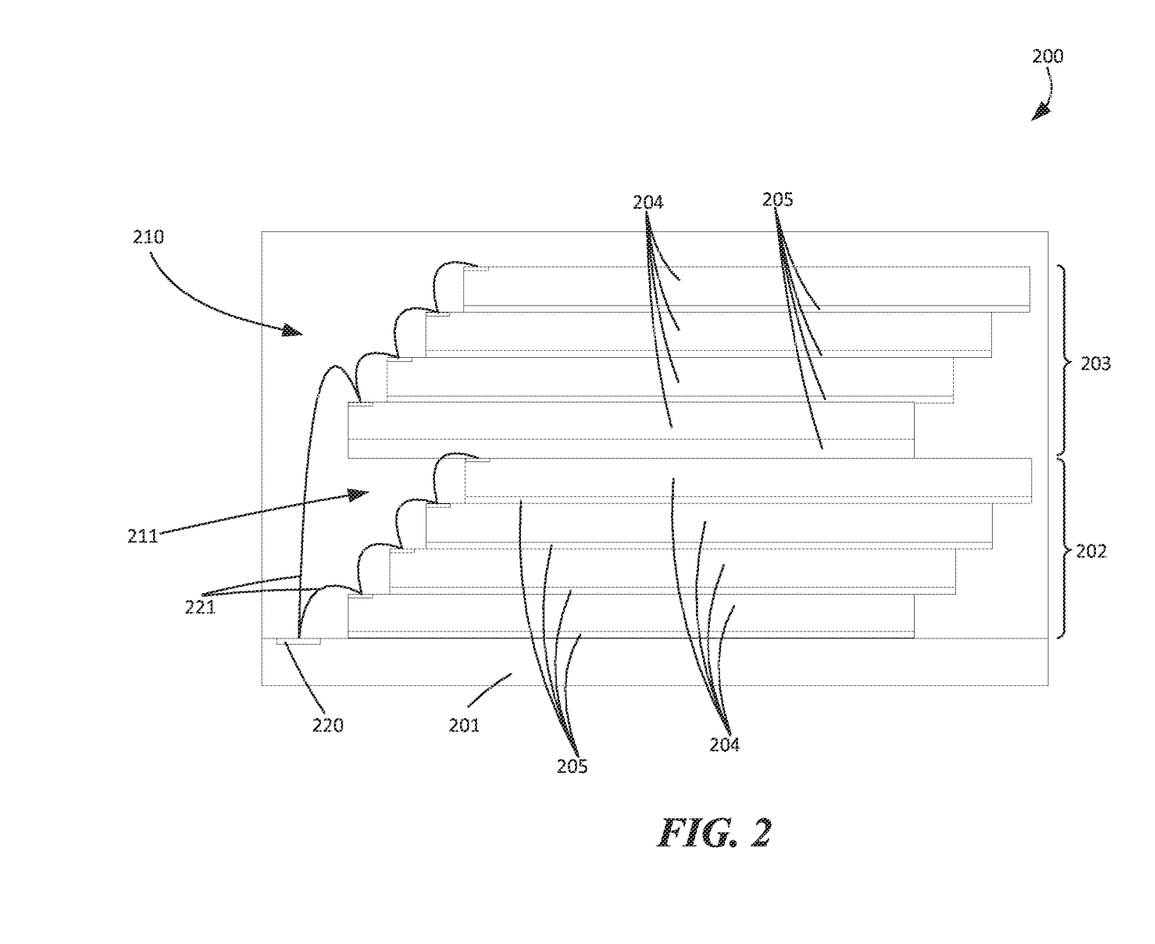
FIG. 2 illustrates a semiconductor device assembly including a shingled stack of individual modules.
Figure 3:
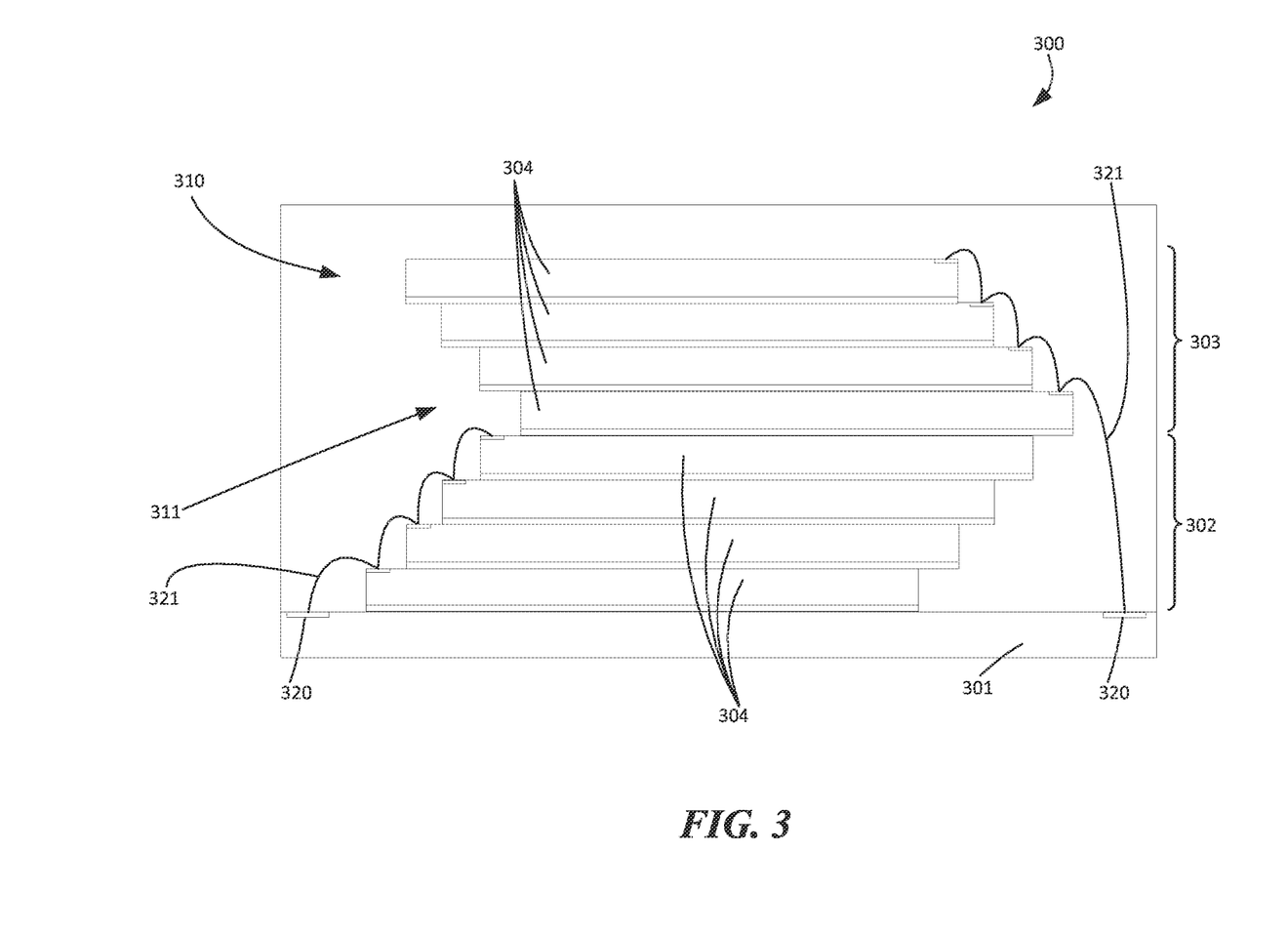
FIG. 3 illustrates a semiconductor device assembly including a shingled stack of individual modules.

To address this limitation, shingled stacks of individual modules can include multiple groups of individual modules arranged in a shingled fashion, and offset either in the same direction (e.g., as shown in FIG. 2) or in opposing directions (as shown in FIG. 3). In this regard, FIG. 2 illustrates a semiconductor device assembly 200 in which a shingled stack 210 of individual modules on a substrate 201 includes two groups 202 and 203 of individual modules 204 which are shingled in the same offset direction, and electrically connected to bonding sites 220 on the substrate 201 by wirebonds 221. As can be seen with reference to FIG. 2, the wirebonds 221 of the first group 202 of individual modules 204 are underneath an overhang region 211 of the second group 203, and therefore may need to be formed before the second group 203 of individual modules 204 is stacked over the first group 202. Moreover, the bottommost individual module 204 of the second group 203 may need to be spaced above the topmost individual module 204 of the first group 202 by a sufficient distance (e.g., provided by a thicker layer of die attach material 205) to allow for a wirebond 221 thereto. Accordingly, drawbacks of this arrangement include the large footprint (e.g., in directions parallel to the surface of the substrate 201) occupied by the shingled stack(s) of individual modules 204 due to the shingled arrangement.

Similar challenges are presented in forming the semiconductor device assembly illustrated in FIG. 3, in which the groups of individual modules are shingled with opposing offset directions. In this regard, FIG. 3 illustrates a semiconductor device assembly 300 in which a shingled stack 310 of individual modules on a substrate 301 includes two groups 302 and 303 of individual modules 304 which are shingled in opposing offset directions, and electrically connected to bonding sites 320 on the substrate 301 by wirebonds 321. As can be seen with reference to FIG. 3, at least some of the wirebonds 321 of the first group 302 of individual modules 304 are underneath an overhang region 311 of the second group 303, and therefore may need to be formed before the second group 303 of individual modules 304 is stacked over the first group 302. Accordingly, drawbacks of this arrangement also include the large footprint (e.g., in directions parallel to the surface of the substrate 301) occupied by the shingled stack(s) of individual modules 304 due to the shingled arrangement.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, increasing the number of individual modules in a stack in a semiconductor device assembly poses manufacturing challenges that are costly to overcome (e.g., multiple iterative stacking and wirebonding operations, varying module-to-module spacing, extensive height, etc.). Accordingly, several embodiments of semiconductor device assemblies in accordance with the present technology can provide semiconductor device assemblies with perimeter profiles designed to overcome these challenges.

In this regard, several embodiments of the present technology are directed to semiconductor device assemblies that include a substrate including a plurality of external connections. A first individual module can be connected to and/or stacked on the substrate. The first individual module can include a first side, a second side opposite the first side, and a first bond pad on the second side. The first individual module can be disposed on the substrate such that the first side of the first individual module faces the substrate. In some embodiments, the first individual module is electrically coupled to an external connection of the substrate via the first bond pad. The assemblies can include a second individual module having a first side, a second side opposite the first side, and a plurality of lateral sides extending between the first and second sides. In some embodiments, the second individual module is disposed over the first individual module such that the first side of the second individual module faces the second side of the first individual module. In some embodiments, a first lateral side of the second individual module includes a first step forming a first overhang portion and a first recess. In some embodiments, the first bond pad is vertically aligned with the first recess of the second individual module.

Several embodiments of individual module assemblies include a substrate comprising a top face and a plurality of bonding sites on the top face. The assemblies can include a stack of individual modules disposed over the substrate and electrically coupled to at least one of the plurality of bonding sites. In some embodiments, the assemblies include an encapsulant at least partially encapsulating the substrate and the stack of individual modules. In some embodiments, at least a portion of a perimeter of an upper individual module of the stack of individual modules has a stepped profile when observed in a plane perpendicular to the top face of the substrate.

Methods of manufacturing individual module assemblies can include providing a substrate having at least one bonding site and stacking a plurality of individual modules on the substrate. One or more of the individual modules can include a plurality of dies encapsulated by an encapsulant material. The individual dies within the encapsulant can be stacked and/or laterally-distributed (e.g., in directions parallel to the substrate). In some embodiments, the methods include forming a stepped profile in at least a portion of the perimeter of at least one of the individual modules such that at least one bond pad of at least one individual module is vertically aligned with and/or positioned within a recess of the stepped profile of another individual module. The methods can include wirebonding the at least one bond pad to the at least one bonding site of the substrate.

Specific details of several embodiments of semiconductor devices are described below. The term "semiconductor device" generally refers to a solid-state device that includes a semiconductor material. A semiconductor device can include, for example, an individual module, a semiconductor substrate, wafer, or die that is singulated from a wafer or substrate. Throughout the disclosure, semiconductor devices are generally described in the context of individual modules; however, semiconductor devices are not limited to individual modules.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 4:
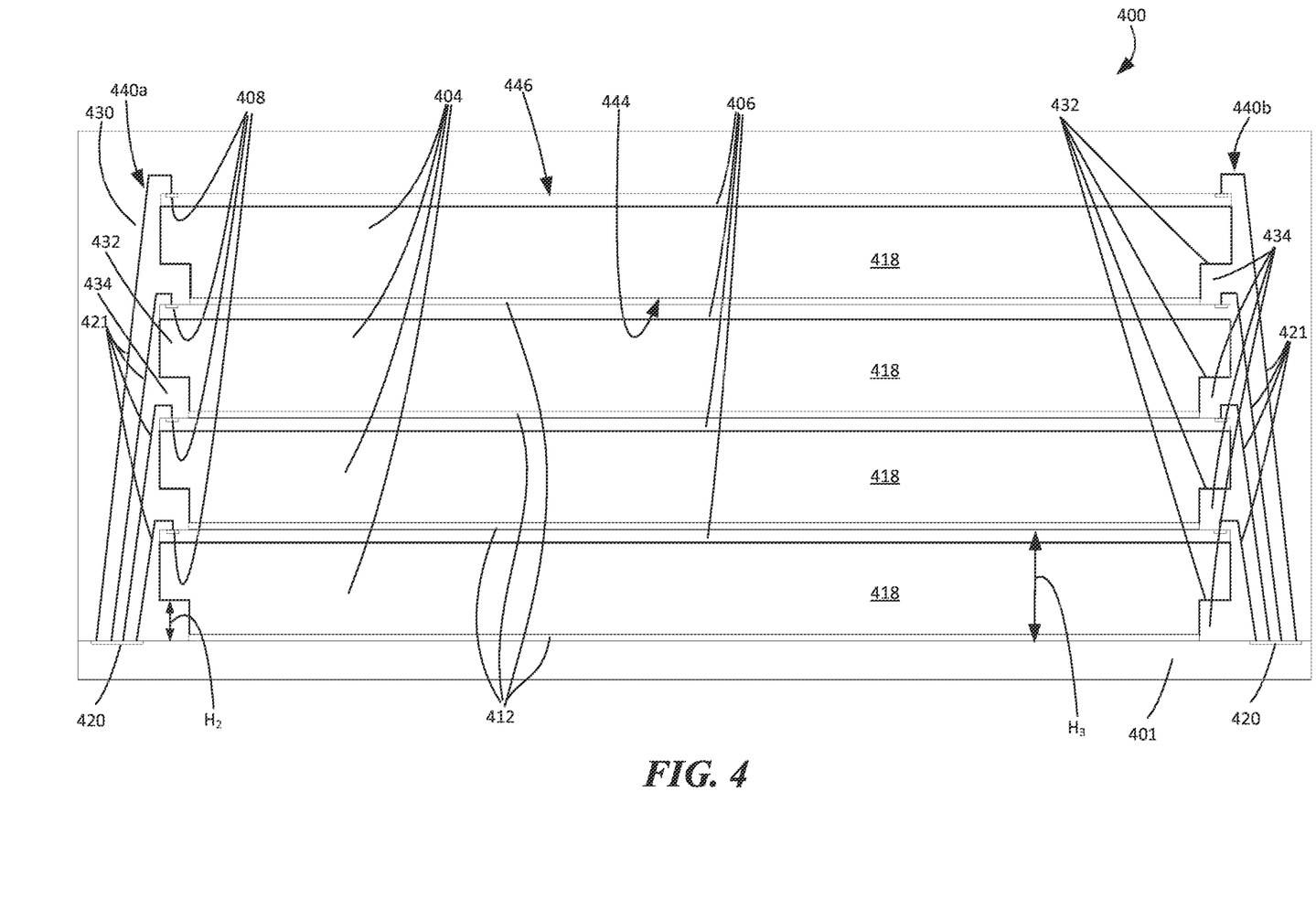
FIG. 4 illustrates a simplified cross-sectional view of a semiconductor device assembly including a stack of individual modules with stepped outer profile in accordance with an embodiment of the present technology.

FIG. 4 is a simplified cross-sectional view of a semiconductor device assembly including a stack of individual modules in accordance with an embodiment of the present technology. The semiconductor device assembly 400 includes a substrate 401 and a stack of a plurality of individual modules 404, at least partially surrounded by an encapsulant 430. As can be seen with reference to FIG. 4, the stack of individual modules includes four individual modules 404. The bottommost individual module of the stack is directly coupled to the substrate 401, and each individual module 404 the stack, other than the bottommost, is offset from an individual module 404 immediately below it by about the same distance in about the same direction by a die attach film or other attach film 412.

One or more of the individual modules 404 includes a substrate portion 406 connected to an overmold portion 418. The substrate portion 406 can include active circuits (e.g., providing functional features such as memory cells, processor circuits, and/or imager devices) and/or passive features (e.g., capacitors, resistors, etc.) as well as bond pads 408 electrically connected to the circuits. The overmold portion 418 can encapsulate or partially encapsulate one or more of the features (e.g., the active or passive features) of the substrate portion 406. In some embodiments, the overmold portion 418 is manufactured from an encapsulant material such as resin, plastic, silicon, oxide, polymer, dielectric materials, or other suitable materials. The overmold portion 418 can be formed as a single structure (e.g., the entire overmold portion 418 can be molded or otherwise formed at the same time) or as multiple structures connected to each other via multiple molding/forming steps. The overmold portion 418 can encapsulate one or more individual dies. The dies encapsulated in the overmold portion 418 can be arranged in stacks and/or can be laterally distributed on the substrate portion. In some embodiments, the overall height H3 of each of the individual modules 404 is greater than a typical height of an individual die. For example, the height H3 of the individual modules 404 can be at least three times, at least four times, at least eight times, and/or at least twenty times the height of an individual die within the overmold portion 418. Other discrete components may be encapsulated or at least partially encapsulated by the overmold portion 418. Such discrete components can include active or passive components such as, but not limited to, capacitors, resistors, inductors, controller die, silicon spacers, etc. In the illustrated embodiments, the substrate portion 406 of each individual module 404 is positioned above the overmold portion 418 of the individual module 404.

The semiconductor device assembly 400 further includes wirebonds 421 connecting each individual module 404 to the substrate 401. More particularly, each individual module 404 in the stack is connected to one or more bonding sites 420 on the substrate 401. In some embodiments, the bond pads 408 of each individual module 404 are connected via wirebonds 421 directly to one or more bonding sites 420 on the substrate 401. In some other embodiments, the bond pads 408 and two or more of the individual modules 404 are connected in series to each other. In some such embodiments, a single wirebond 421 connects to a bonding site 420 (e.g., contrasting with the plurality of wirebonds 421 connected to the illustrated bonding site 420 in FIG. 4).

In some embodiments, the height of the wirebonds 421, as measured perpendicular to the respective bond pads 408 to which they attach, is greater than the thickness of the die attach film 412 or other adhesive used to connect the individual modules 404 to each other. For example, the height of the wirebonds 421 can be at least 110%, at least 130%, at least 150%, at least 175%, at least 200%, and/or at least 300% of the thickness of the die attach film 412.

According to one aspect of the subject technology, one or more of the individual modules 404 includes a stepped geometry on one or more of a first end 440a and a second end 440b of the semiconductor device 400. More specifically, the stepped geometry of the individual module 404 can include an upper overhang portion 432 and a lower recess 434. The lower recess 434 can be recessed with respect to a lateral edge of the overhang portion 432 in a direction parallel to the substrate. In some embodiments, fewer than all of the individual modules 404 include a stepped portion. In some embodiments, each individual module 404 of the semiconductor stack includes a stepped portion on at least one side/end of the individual module 404

The stepped portions of the individual modules 404 can be formed via a molding process (e.g., injection molding, or other molding processes), using a grind wheel, via a cutting tool, or by some other manufacturing means. For example, a grind wheel can be used to remove material (e.g., to form the recess 434) from the overmold portion 418 or from some other portion of the individual module 404. Preferably, the overhang portions 432 of the stepped portions of the individual modules 404 are positioned above the recesses 434. In some embodiments, however, one or more of the stepped portions of the individual modules 404 has a lower overhang portion positioned beneath a recess. In some embodiments, one or more of the bond pads 408 are positioned within the recesses 434 and/or vertically aligned (e.g., aligned in a direction perpendicular to the substrate 401 and/or perpendicular to the first side 444 of the individual module 404) with the recesses of the respective individual modules 404 positioned directly above the individual module on/in which the respective bond pads 408 are formed. For example, one or more bond pads 408 can be positioned between an outer lateral edge and an inner sidewall of the recessed portion 434 of the individual module 404 above the bond pad 408.

Figure 5:
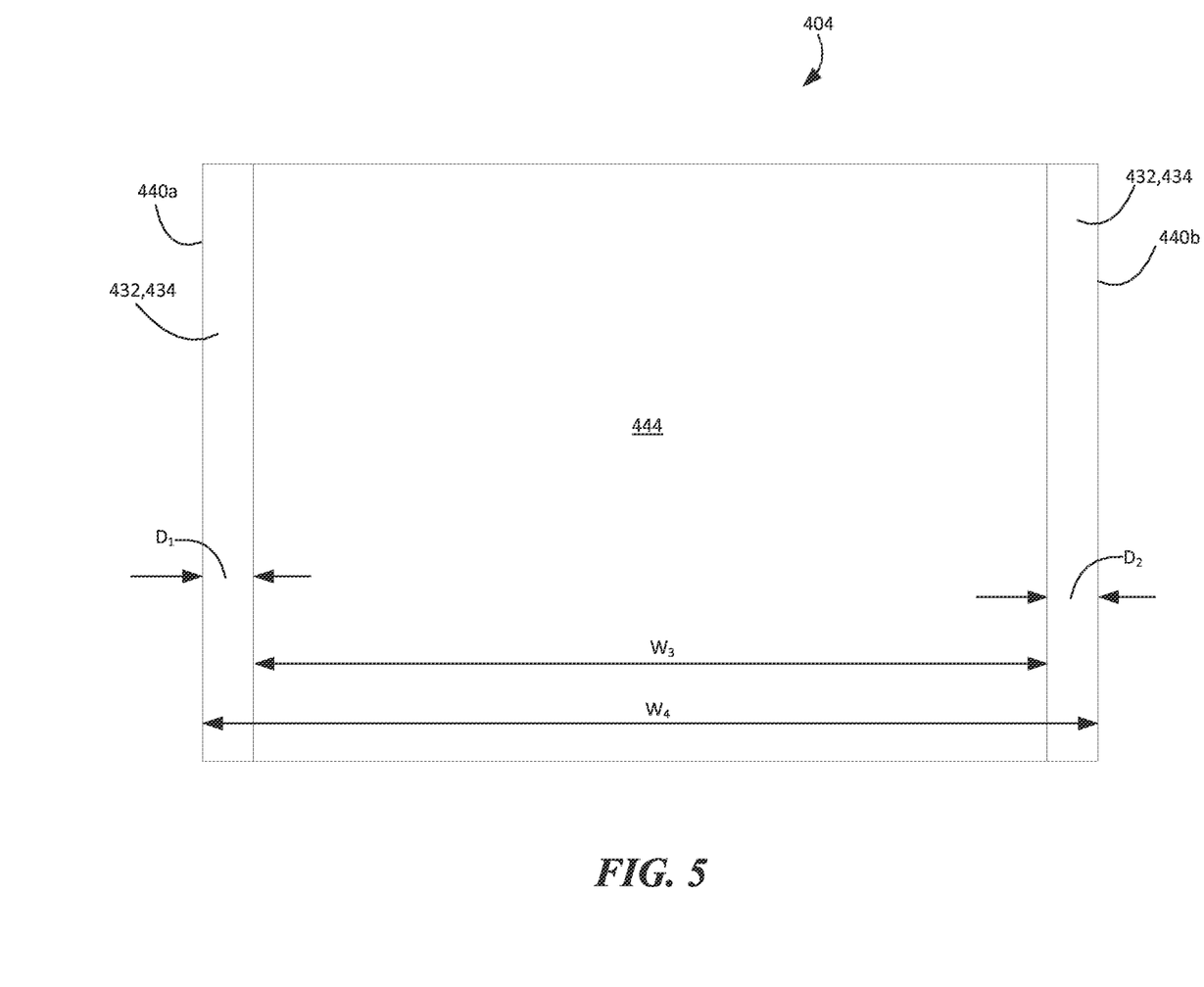
FIG. 5 illustrates a bottom plan view of an individual module of the semiconductor device assembly of FIG. 4.

FIG. 5 illustrates a bottom plan view of one of the individual modules 404 having a stepped portion on both a first end 440a and the second end 440b. Including stepped portions on both the first and second ends 440a, 440b of the individual module 404 can result in an individual module 404 having a first side 444 (e.g., lower side) with a width W3 less than a width W4 of a second side 446 (e.g. an upper side, as illustrated in FIG. 4) of the individual module 404. In some embodiments, the width W3 of the first side 444 of the individual module 404 is between approximately 70%-85%, approximately 75%-95%, approximately 80%-90%, and/or approximately 65%-80% of the width W4 of the second side 446 of the individual module 404. Some embodiments, the width W3 of the first side 444 of the individual module 404 is approximately 85% of the width W4 of the second side 446 the individual module 404. The depths D1, D2 of the respective recess portions 434 at the ends 440a, 440b of the individual module 404, as measured parallel to the widths W3, the W4, can be equal to each other. In some embodiments, one of the depths D1, D2 is greater than the other depth D1, D2.

Referring back to FIG. 4, the height H2 (as measured perpendicular to the substrate 401) of the recess portion 434 between approximately 10%-60%, approximately 20%-65%, approximately 30%-55%, approximately 50%-70%, and/or approximately 25%-45% of the overall height H3 the individual module 404. Preferably, height H2 of the recess portion 434 is sufficient to allow access to the bondpad 408 of the individual module 404 positioned within the recess portion 434 for purposes of wirebonding. Preferably, the die attach film 412 has a same size and shape of the first side 444 of the individual modules 404. In some such embodiments, the die attach film 412 adds height to the recess portion 434 by spacing the overhang portion 432 from the individual module 404 or substrate 401 positioned below the recess portion 434.

According to one aspect of the subject technology, the use of stepped features on the outer edges of the individual modules 404 can reduce the overall height, width, and/or depth of the semiconductor device assembly 400, as compared to assemblies using spacer tapes or shingled arrangements. Reducing the size of the semiconductor device assemblies can allow for more compact and efficient distribution of the assemblies within a given application. Limiting the use of spacer tape can also provide cost reduction in the manufacture of the semiconductor device assembly 404.

Figure 6:
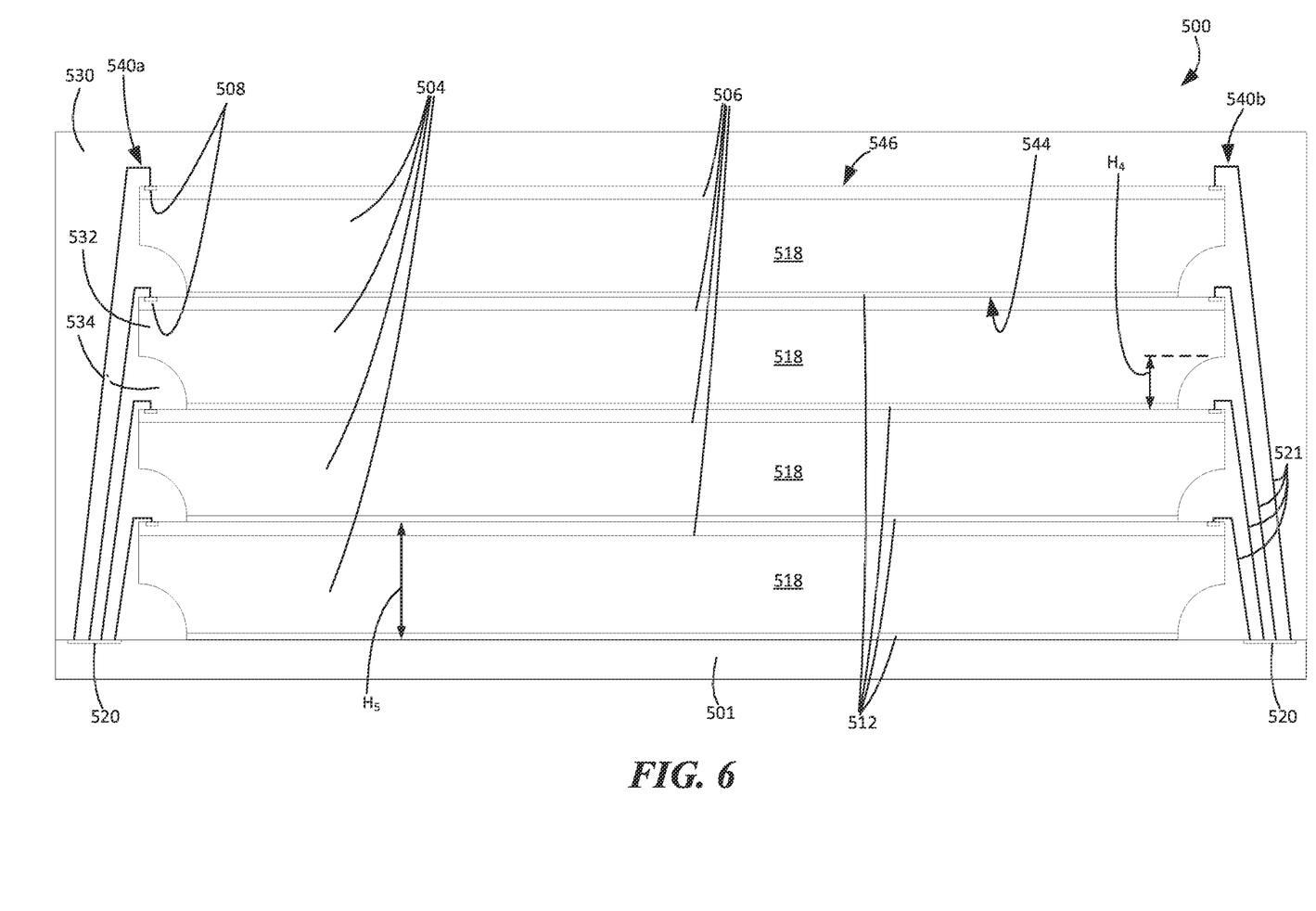
FIG. 6 illustrates a simplified cross-sectional view of a semiconductor device assembly including a stack of individual modules with a filleted outer profile in accordance with an embodiment of the present technology.

FIG. 6 illustrates an embodiment of a semiconductor device assembly 500 having many similar or identical features to the semiconductor device assembly 400 described above. Like reference numbers are used to identify like features between the assemblies 400 and 500. For example, both assemblies can include a substrate 401, 501, die attachment film 412, 512, and wirebonds 421, 521.

While the stepped feature was described above with respect to semiconductor device assembly 400, many or all of the advantages provided by the stepped profile may be realized via a filleted profile. For example, as illustrated in FIG. 6, one or more ends 540a, 540b can include a filleted profile resulting in an overhang portion 532 and a lower recess 534. The filleted profile can be formed, for example, in an overmold portion 518 of one or more of the individual modules 504.

The height H4 of the lower recesses 534 of the individual modules 504 can be similar to or the same as the height H2 the lower recesses 434 of the individual modules 404. Similarly, the overall height H5 of the individual modules 504 can be similar to or the same as the overall height H3 of the individual modules 404. The respective depths of the lower recesses 534, as measured parallel to the substrate 501, can be similar to or the same as the depths D1, D2 of the lower recesses 434. In some embodiments, the overall dimensions and ratios between dimensions illustrated in FIG. 5 and described above apply equally to the individual modules 504 illustrated in FIG. 6.

Radius of curvature the lower recesses 534 can be constant or variable from an upper end of the lower recess 534 to lower end of the recess 534. Preferably, the radius of curvature, height H6, and depth of the lower recesses 534 is selected such that the lower recess 534 is sized and shaped to allow for easy wirebonding between bondpads 508 of the individual modules 504 and the substrate 501. Other recess shapes may be implemented. For example, the recess(es) of a given individual module may include both curved and flat portions. In some embodiments, the shape of the recess may be a sloped surface extending from a lateral edge of an individual module to that individual module's second (e.g., lower) side.

Figure 7:
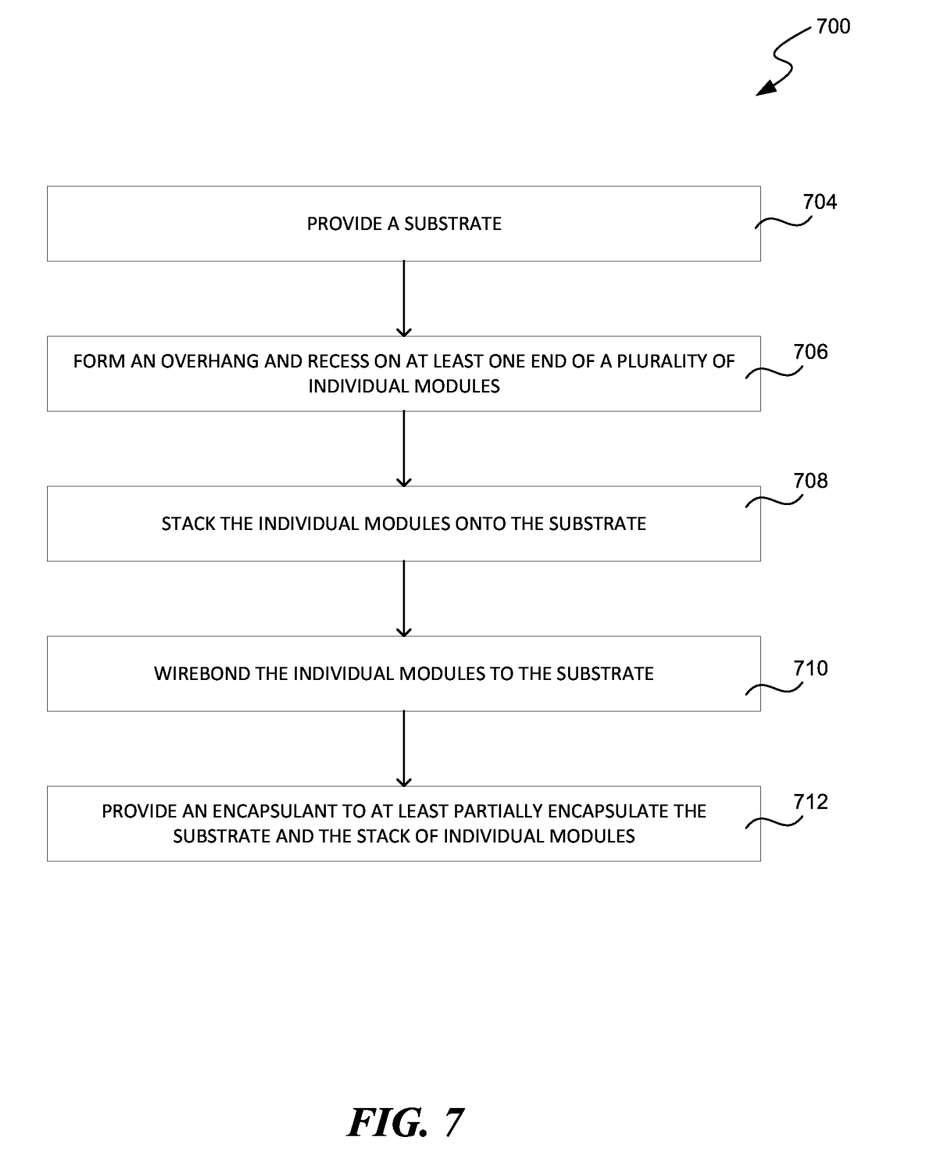
FIG. 7 is a flow chart illustrating a method of making a semiconductor device assembly in accordance with one embodiment of the present technology.

FIG. 7 is a flow chart illustrating a method of making a semiconductor device assembly. The method includes providing a substrate (box 704), forming an overhang and a recess on at least one end of a plurality of individual modules (box 706) and stacking the individual modules onto the substrate (box 708). Forming the overhang in recess on the ends of the individual modules can include molding the individual modules into a shape having recesses and overhangs, and/or cutting/grinding the recesses into the individual modules. For example, the overmold portion of one or more of the individual modules can be molded in a stepped or other overhanging shape. In some embodiments, grind wheels or cutting blades described in U.S. patent application Ser. No. 16/237,051 (filed on Dec. 31, 2018, and entitled Systems and Methods for Forming Semiconductor Cutting/Trimming Blades, the entire disclosure of which is hereby incorporated by reference herein in its entirety) can be used to form stepped, beveled, filleted, and/or other-shaped recesses in the semiconductor device. Preferably, the individual modules are stacked vertically and aligned with each other such that, when observed from above, only the topmost individual module is viewable. In some embodiments, the individual modules in a given stack are aligned with each other, such that each individual module occupies substantially the same footprint when observed from above. The method further includes wirebonding the individual modules to the substrate (box 710), which can be performed subsequent to stacking individual modules, and providing an encapsulant to at least partially encapsulate the substrate and the stack of individual modules (box 712). The wirebonding can be performed in a single operation uninterrupted by any stacking. In some embodiments, the method of making the semiconductor device assembly includes forming (e.g., molding and/or cutting) the overmold portion of one or more of the individual modules.

In some embodiments, the method does not include forming overhang in recess in the individual modules because the individual modules are provided with such features. Additionally, in some embodiments some portion of the wirebonding is performed before positioning the stack of individual modules onto the substrate. For example, one or more wirebonds between the individual modules may be formed in advance. The method can include attaching the individual modules to each other using die attach film or other films or adhesives.

Figure 8:
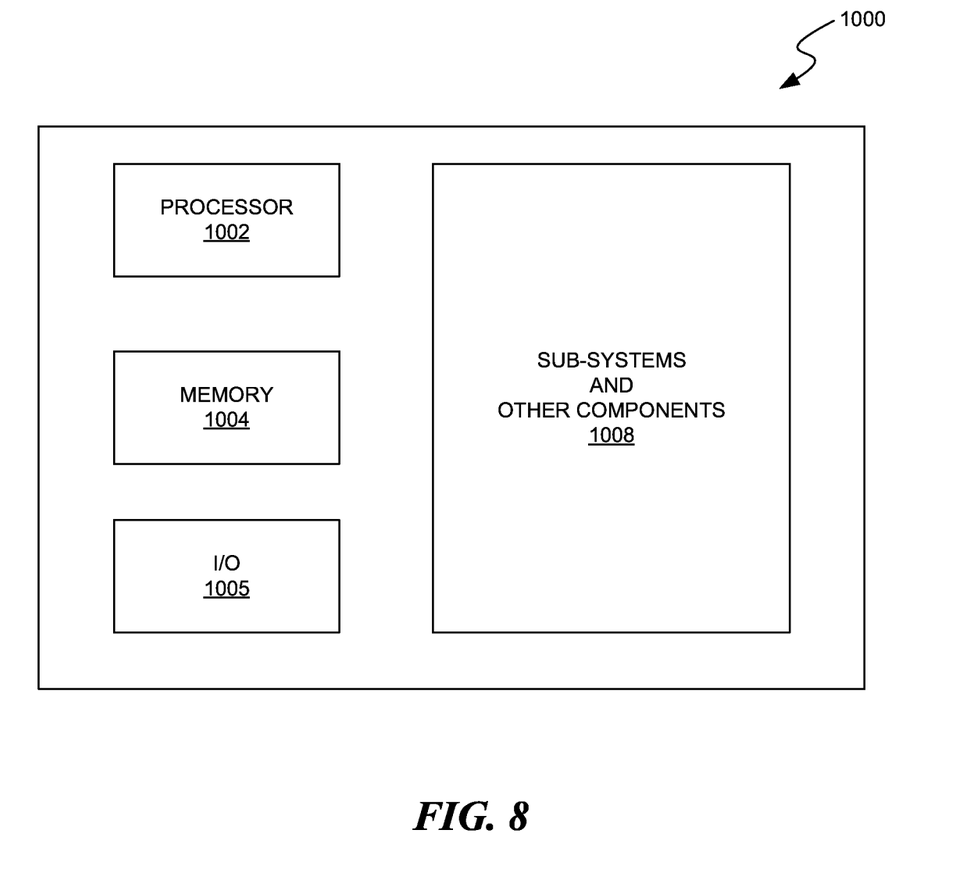
FIG. 8 is a schematic view showing a system that includes a semiconductor device assembly configured in accordance with an embodiment of the present technology.

Any one of the semiconductor device assemblies having the features described above (e.g., with reference to FIGS. 4-8) can be incorporated into any of a myriad of larger and/or more complex systems, a representative example of which is system 1000 shown schematically in FIG. 8. The system 1000 can include a processor 1002, a memory 1004 (e.g., SRAM, DRAM, flash, and/or other memory devices), input/output devices 1005, and/or other subsystems or components 1008. The individual modules and individual module assemblies described above can be included in any of the elements shown in FIG. 8. The resulting system 1000 can be configured to perform any of a wide variety of suitable computing, processing, storage, sensing, imaging, and/or other functions. Accordingly, representative examples of the system 1000 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1000 include lights, cameras, vehicles, etc. With regard to these and other examples, the system 1000 can be housed in a single unit or distributed over multiple interconnected units, e.g., through a communication network. The components of the system 1000 can accordingly include local and/or remote memory storage devices and any of a wide variety of suitable computer-readable media.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A semiconductor device assembly, comprising:
   a substrate including a plurality of external connections;
   a first individual module comprising—
   a first side;
   a second side opposite the first side;
   a plurality of dies between the first side and the second side; and
   a first bond pad on the second side, the first individual module disposed on the substrate such that the first side of the first individual module faces the substrate, the first individual module electrically coupled to an external connection of the plurality of external connections via the first bond pad; and
   a second individual module comprising—
   a first side;
   a second side opposite the first side;
   a plurality of dies between the first side and the second side; and
   a plurality of lateral sides extending between the first and second sides, the second individual module disposed over the first individual module such that the first side of the second individual module faces the second side of the first individual module;
   wherein—
   a first lateral side of the second individual module includes a first overhang portion and a first recess;
   the first bond pad is vertically aligned with the first recess of the second individual module.

2. The semiconductor device assembly of claim 1, wherein the first individual module includes a second bond pad, a second lateral side of the second individual module includes a second overhang portion and a second recess, and the second bond pad is positioned within the second recess.

3. The semiconductor device assembly of claim 1, further comprising a third individual module comprising:
a first side;
a second side opposite the first side;
a plurality of dies between the first side and the second side; and
a plurality of lateral sides extending between the first and second sides, the third individual module disposed over the second individual module such that the first side of the third individual module faces the second side of the second individual module; and
wherein—
the second individual module comprises a third bond pad on the second side of the individual module;
the second individual module is electrically coupled to an external connection of the substrate via the third bond pad;
a third lateral side of the third individual module comprises a third overhang portion and a third recess; and
the third bond pad is positioned within the third recess.

4. The semiconductor device assembly of claim 3, wherein the first individual module and the second individual module are electrically coupled to a same external connection of the substrate via the first bond pad and the second bond pad, respectively.

5. The semiconductor device assembly of claim 1, further comprising an attachment film between the first individual module and the second individual module.

6. The semiconductor device assembly of claim 1, wherein the second side of the first individual module has a same shape and size as the second side of the second individual module, and wherein the second sides of the first and second individual modules are aligned when observed from a perspective perpendicular to the second side of the second individual module.

7. The semiconductor device assembly of claim 1, wherein the second side of the second individual module is smaller in size than the first side of the first individual module.

8. The semiconductor device assembly of claim 1, wherein the first and second individual modules have a same size and geometry.

9. The semiconductor device assembly of claim 1, further comprising an encapsulant at least partially encapsulating the substrate, the first individual module, and the second individual module.

10. The semiconductor device assembly of claim 1, wherein a bond wire extends into the first recess of the second individual module to connect to the first bond pad.

11. A semiconductor device assembly comprising:
a substrate comprising a top face and a plurality of bonding sites on the top face;
a stack of individual modules disposed over the substrate and electrically coupled to at least one of the plurality of bonding sites, each of the individual modules comprising a plurality of dies therein; and
an encapsulant at least partially encapsulating the substrate and the stack of individual modules;
wherein—
at least a portion of a perimeter of an upper individual module of the stack of individual modules has a stepped profile when observed from a perspective normal to a plane that is perpendicular to the top face of the substrate.

12. The semiconductor device assembly of claim 11, wherein the stepped profile forms an upper overhang portion and a lower recess.

13. The semiconductor device assembly of claim 12, wherein an individual module below the upper individual module includes a bond pad vertically aligned with the lower recess.

14. The semiconductor device assembly of claim 13, wherein at least a portion of a perimeter of the individual module below the upper individual module has a stepped profile forming an upper overhang portion and a lower recess.

15. The semiconductor device assembly of claim 11, wherein the stack of individual modules includes at least three individual modules, and wherein a portion of the perimeter of each of the at least three individual modules has a stepped profile when observed in a plane perpendicular to the top face of the substrate.

16. The semiconductor device assembly of claim 15, wherein each individual module in the stack of individual modules includes a module substrate and a module overmold connected to a lower surface of the module substrate, and wherein the stepped profile is formed in the module overmold.

17. The semiconductor device assembly of claim 16, wherein each individual module in the stack of individual modules includes a plurality of individual dies encapsulated in the module overmold.

18. A method of manufacturing a semiconductor device assembly, the method comprising:
providing a substrate having at least one bonding site;
stacking a plurality of individual modules on the substrate;
forming a stepped profile in at least a portion of the perimeter of at least one of the individual modules such that at least one bond pad of at least one individual module is vertically aligned with a recess of the stepped profile of another individual module;
wirebonding the at least one bond pad to the at least one bonding site of the substrate.

19. The method of claim 18, further comprising encapsulating at least a portion of the substrate and a plurality of individual modules in an encapsulant.

20. The method of claim 18, wherein forming a stepped profile comprises molding a portion of at least one of individual modules in a stepped mold.

21. The method of claim 18, wherein forming a stepped profile comprises using a cutting tool to cut away a portion of the perimeter of an individual module.

22. The method of claim 18, wherein forming a stepped profile in at least a portion of the perimeter of at least one of the individual modules comprises forming the stepped profile in the entire perimeter of the at least one individual module.

23. The method of claim 18, wherein forming a stepped profile comprises molding an overmold portion of at least one of the individual modules in a stepped mold.

* * * * *